United States Patent
Nemani et al.

(10) Patent No.: US 8,153,348 B2
(45) Date of Patent: Apr. 10, 2012

(54) PROCESS SEQUENCE FOR FORMATION OF PATTERNED HARD MASK FILM (RFP) WITHOUT NEED FOR PHOTORESIST OR DRY ETCH

(75) Inventors: Srinivas D. Nemani, Sunnyvale, CA (US); Shankar Venkataraman, Santa Clara, CA (US); Ellie Y. Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 750 days.

(21) Appl. No.: 12/034,000

(22) Filed: Feb. 20, 2008

(65) Prior Publication Data
US 2009/0208880 A1 Aug. 20, 2009

(51) Int. Cl.
G03F 7/26 (2006.01)
(52) U.S. Cl. .......................... 430/313; 430/330
(58) Field of Classification Search .............. 430/311, 430/313, 330
See application file for complete search history.

(56) References Cited

U.S. PATENT DOCUMENTS

| | | | |
|---|---|---|---|
| 5,558,717 A | 9/1996 | Zhao et al. | |
| 6,009,830 A | 1/2000 | Li et al. | |
| 6,024,044 A | 2/2000 | Law et al. | |
| 6,302,964 B1 | 10/2001 | Umotoy et al. | |
| 6,383,954 B1 | 5/2002 | Wang et al. | |
| 6,511,793 B1 | 1/2003 | Cho et al. | |
| 6,528,332 B2 | 3/2003 | Mahanpour et al. | |
| 6,548,416 B2 | 4/2003 | Han et al. | |
| 6,614,181 B1 | 9/2003 | Harvey et al. | |
| 6,794,290 B1 | 9/2004 | Papasouliotis et al. | |
| 6,830,624 B2 | 12/2004 | Janakiraman et al. | |
| 6,833,052 B2 | 12/2004 | Li et al. | |
| 6,852,640 B2 | 2/2005 | Gutsche | |
| 6,890,403 B2 | 5/2005 | Cheung | |
| 6,900,002 B1 * | 5/2005 | Plat et al. | 430/328 |
| 6,958,112 B2 | 10/2005 | Karim et al. | |
| 2001/0054387 A1 | 12/2001 | Frankel et al. | |
| 2002/0127350 A1 | 9/2002 | Ishikawa et al. | |
| 2004/0048492 A1 | 3/2004 | Ishikawa et al. | |
| 2004/0079118 A1 | 4/2004 | M'Saad et al. | |
| 2004/0161899 A1 | 8/2004 | Luo et al. | |
| 2004/0175501 A1 | 9/2004 | Lukas et al. | |
| 2005/0001556 A1 | 1/2005 | Hoffman et al. | |

(Continued)

OTHER PUBLICATIONS

PCT International Search Report and Written Opinion mailed Aug. 28, 2009; International Application No. PCT/US2009/033250, 11 pages.

*Primary Examiner* — Kathleen Duda
(74) *Attorney, Agent, or Firm* — Kilpatrick Townsend & Stockton LLP (57) ABSTRACT

Method and systems for patterning a hardmask film using ultraviolet light is disclosed according to one embodiment of the invention. Embodiments of the present invention alleviate the processing problem of depositing and etching photoresist in order to produce a hardmask pattern. A hardmask layer, such as, silicon oxide, is first deposited on a substrate within a deposition chamber. In some cases, the hardmask layer is baked or annealed following deposition. After which, portions of the hardmask layer are exposed with ultraviolet light. The ultraviolet light produces a pattern of exposed and unexposed portions of hardmask material. Following the exposure, an etching process, such as a wet etch, may occur that removes the unexposed portions of the hardmask. Following the etch, the hardmask may be annealed, baked or subjected to a plasma treatment.

15 Claims, 6 Drawing Sheets

U.S. PATENT DOCUMENTS

2005/0227378 A1* 10/2005 Moise et al. ............... 438/3
2005/0250340 A1 11/2005 Chen et al.
2007/0212648 A1 9/2007 Lalbahadoersing
2010/0255611 A1* 10/2010 Wang ....................... 438/3

* cited by examiner

PROCESS SEQUENCE FOR FORMATION OF PATTERNED HARD MASK FILM (RFP) WITHOUT NEED FOR PHOTORESIST OR DRY ETCH

BACKGROUND OF THE INVENTION

This disclosure relates in general to photolithography and, but not by way of limitation, to resist free patterning (RFP) photolithography amongst other things.

Generally speaking, photolithography is a process used in microfabrication to selectively remove portions of a thin film. Typically, light is used to transfer a geometric pattern from a photomask or a reticle to a light-sensitive chemical photoresist on the substrate. A series of chemical treatments then engraves the exposure pattern into the material underneath the photoresist. In a complex integrated circuit (for example, modern CMOS), a wafer can go through the photolithographic cycle up to 50 times.

A traditional photolithography process may include the following steps: preparation, photoresist application, exposure, developing, etching, and removal. A wafer may be prepared by heating it to a temperature sufficient to drive off any moisture that may be present on the wafer surface. Wafers that have been in storage must be chemically cleaned to remove contamination. A liquid or gaseous adhesion promoter, such as, for example, hexamethyldisilazane (HMDS), may be applied to promote adhesion of the photoresist to the wafer.

The wafer may then be covered with photoresist by various deposition techniques such as, for example, spin coating, chemical vapor deposition, atomic layer deposition, physical vapor deposition and variants thereof. The photoresist-coated wafer may then be soft-baked or prebaked to drive off excess solvent. After prebaking, the photoresist may be exposed to a pattern of intense light. In response to the light exposure, a positive photoresist becomes less chemically robust, while a negative photoresist becomes more robust. This chemical change allows some of the photoresist to be removed by a developer solution. A post-exposure bake is often performed before developing, typically to help reduce standing wave phenomena caused by the destructive and constructive interference patterns of the incident light.

Wafer may then be hard-baked. In some cases the hardbake is performed at 120° to 180° C. for 20 to 30 minutes. The hard bake solidifies the remaining photoresist, to make a more durable protecting layer in future ion implantation, wet chemical etching, or plasma etching. Following the hardbake, the wafer is etched using, for example, a liquid ("wet") or plasma chemical agent that removes the uppermost layer of the substrate in the areas that are not protected by photoresist.

Following the etching, the photoresist can be removed from the substrate. A liquid resist stripper may be used to chemically alter the resist so that it no longer adheres to the substrate. Alternatively, photoresist may be removed by ashing, which oxidizes the photoresist with an oxygenated plasma. Various other techniques and/or modifications may be performed in a photolithography system.

These traditional photolithography processes are time and process intensive. Embodiments of the present invention address decrease the process and time demands of a photolithography system.

BRIEF SUMMARY OF THE INVENTION

Method and systems for patterning a hardmask film using ultraviolet light is disclosed according to one embodiment of the invention. Embodiments of the present invention alleviate the processing problem of depositing and etching photoresist in order to produce a hardmask pattern. A hardmask layer, such as, silicon oxide, is first deposited on a substrate within a deposition chamber. In some cases, the hardmask layer is baked or annealed following deposition. After which, portions of the hardmask layer are exposed with ultraviolet light, such as light less than 348 nm. The ultraviolet light produces a pattern of exposed and unexposed portions of hardmask material. Following the exposure, an etching process, such as a wet etch including for example HF, $NH_4OH$, SC1, and RCA, may occur that removes the unexposed portions of the hardmask. Following the etch, the hardmask may be annealed, baked or subjected to a plasma treatment.

The annealing processes may include a steam anneal, a thermal anneal, an inductively coupled plasma anneal, a capacitively-coupled plasma anneal, an ultraviolet light anneal, an e-beam anneal, an acid vapor catalysis anneal, a base vapor catalysis anneal and a microwave anneal. The anneal may occur in the present of an inert gas of in an atmosphere including $N_2$, Ar, $O_2$, $H_2O$, $NH_3$, $N_2/H_2$, and $N_2O$. Moreover, the plasma treatment may include a capacitively-coupled plasma and an inductively-coupled plasma. The plasma treatment may occur in the presence of $N_2$, Ar, $O_2$, $H_2O$, $NH_3$, $N_2/H_2$, and $N_2O$.

The substrate may include a silicon substrate, a III-V compound substrate, a silicon/germanium substrate, an epi-substrate, a silicon-on-insulator substrate, a display substrate, a liquid crystal display substrate, a plasma display substrate, an electro luminescence lamp substrate, and a light emitting diode substrate. Moreover, one or more of the processes and/or steps may occur in a deposition chamber using a process, such as, for example, spin coating, chemical vapor deposition, atomic layer deposition, and physical vapor.

Further areas of applicability of the present disclosure will become apparent from the detailed description provided hereinafter. It should be understood that the detailed description and specific examples, while indicating various embodiments, are intended for purposes of illustration only and are not intended to necessarily limit the scope of the disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

The ensuing description provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment. It being understood that various changes may be made in the function and arrangement of elements without departing from the spirit and scope as set forth in the appended claims.

Embodiments of the present invention include processes, methods and devices that provide patterned hardmask layers eliminating the need for photoresist deposition and etching. Embodiments of the invention deposit a hardmask layer, for example a hardmask layer comprising silicon oxide, on a substrate. In some embodiments, the hardmask may undergo an annealing or baking process prior to exposure. Portions of the hardmask layer may then be exposed with ultraviolet light to produce an exposure pattern on the hardmask layer. Following exposure, a wet etch may be applied to remove unexposed portions of the hardmask layer, leaving those portions of the hardmask layer that were exposed. The wet etch may include, for example, HF. Following the wet etch, in some embodiments, the hardmask pattern may be subject to a plasma treatment or an anneal treatment that further modify the properties of the hardmask layer for future processes. Various modifications and variants of this exemplary process may be included.

Such hardmask patterning may be used, for example, in semiconductor fabrication, microelectromechanical system fabrication, solar cell fabrication and other device fabrication.

Figure 1:
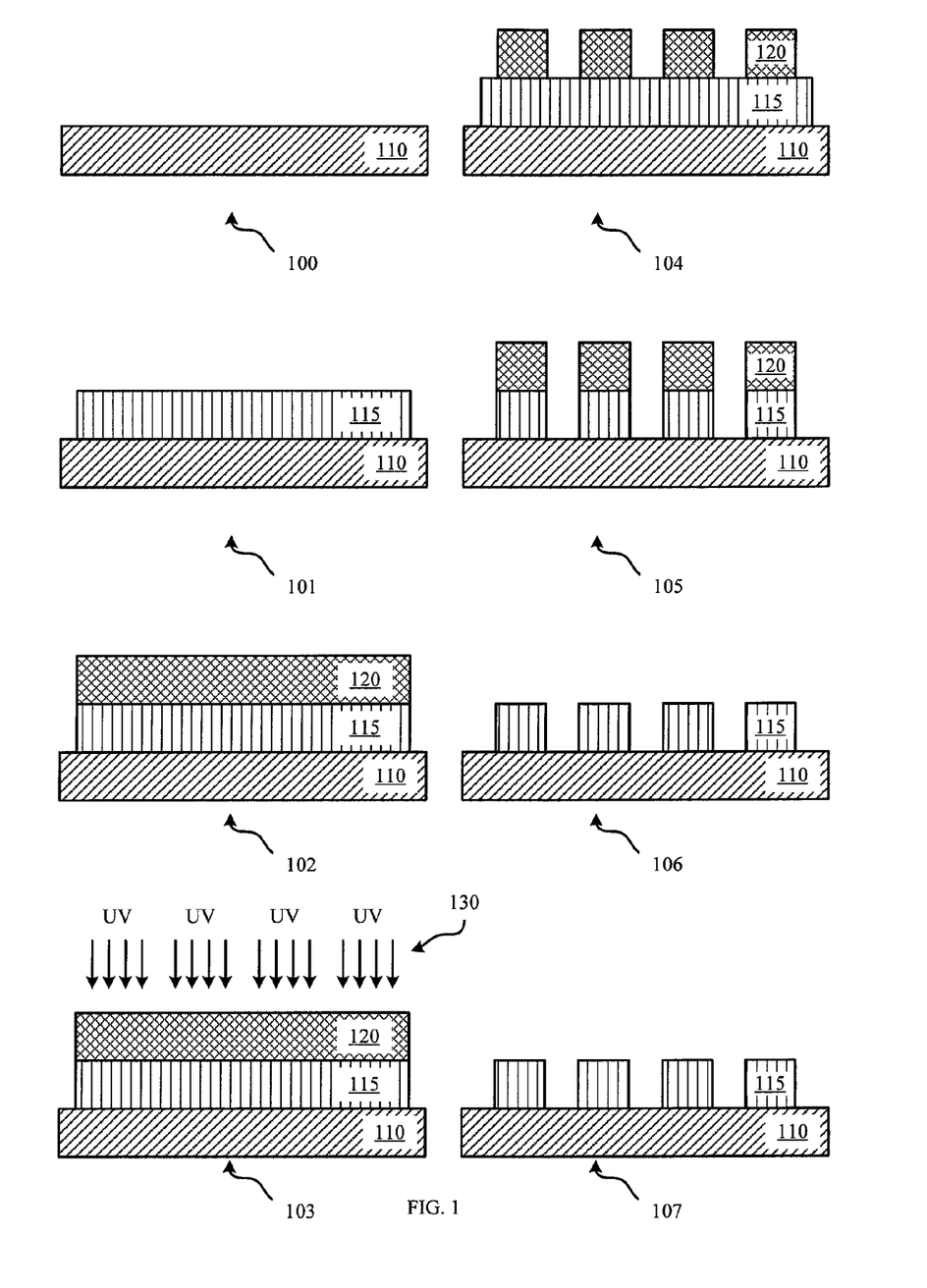
FIG. 1 shows the results of various steps in a typical hardmask patterning process.

FIG. 1 shows the results of various steps in a typical hardmask etching process. A substrate 110 is provided at step 100. A hardmask layer 115 is deposited on the substrate 110 the results of which are shown at 101, after which a photoresist 120 is deposited on the hardmask layer 115 the results of which are shown at 102. Now turning to 103, UV light 130 exposes the photoresist 120 in a specific pattern. The UV light 130 may come from a stepper or other photolithography system. The portions of the photoresist 120 exposed with UV light 130 may then be removed using a PR develop step the results of which are shown at 104. The hardmask may then be dry or wet etched the results of which are shown at 105. Following the etching of the photoresist, the photoresist may be removed using an ashing process the results of which are shown at 106 followed by a wet etch step 107. As these figures and description show, typically etching of a hardmask is process intensive. Most notably the process requires the use of a photoresist that requires deposition and etching steps. While there are variations to the hardmask etching process described above, hardmask etching processes typically include these time consuming photoresist deposition and etching steps.

Figure 2:
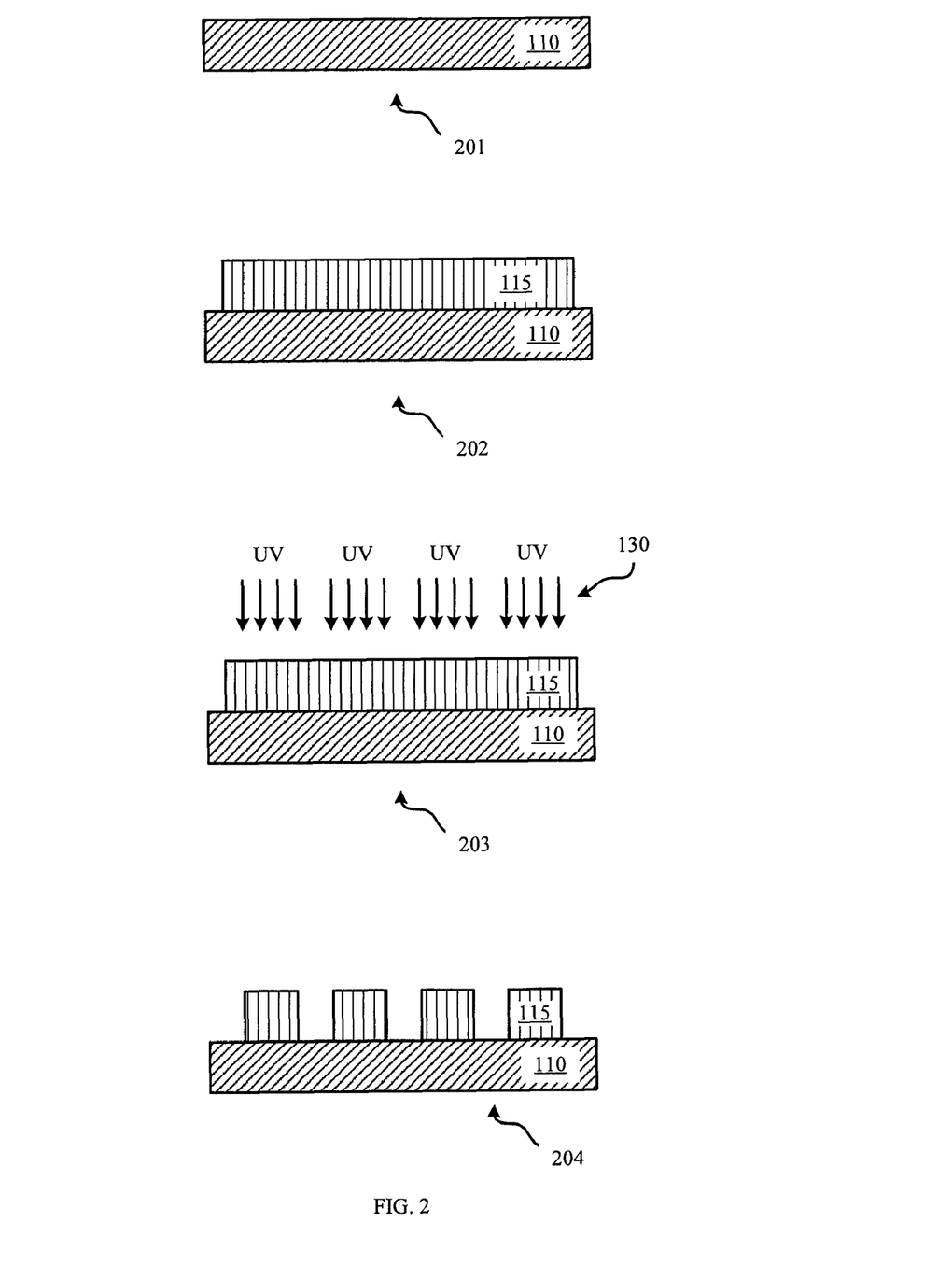
FIG. 2 shows the results of various steps in a hardmask patterning process according to one embodiment of the invention.

Embodiments of the present invention, on the other hand, include a hardmask etching processes that eliminate the need for photoresist deposition and etching steps. FIG. 2 shows the results of a hardmask etching process without the use of photoresists according to one embodiment of the invention. A substrate 110 is provided as shown at 201, which is similar to 100 in FIG. 1. The substrate 110 may be a silicon substrate, a III-V compound substrate, a silicon/germanium substrate, an epi-substrate, a silicon-on-insulator substrate, a display substrate such as, for example, a liquid crystal display (LCD), a plasma display, an electro luminescence (EL) lamp display, or a light emitting diode (LED) substrate, for example. In some embodiments, the substrate 110 may include at least one structure, such as, for example, trench structure, well, junction, diode, transistor, metal-oxide-semiconductor field effect transistor (MOSFET), interlayer dielectric (ILD) structure, inter-metal dielectric (IMD) structure, circuit, other semiconductor structure or various combinations thereof. The substrate 110 may be a semiconductor wafer (e.g., a 200 mm, 300 mm, 400 mm, etc. silicon wafer). In some embodiments, the substrate 110 may have at least one trench. In some embodiments, the substrate 110 may be a semiconductor wafer (e.g., a 200 mm, 300 mm, 400 mm, etc. silicon wafer) and may include structures, device components, etc., formed in earlier processes. For example, the substrate may include trenches with high height to width aspect ratios (e.g., an aspect ratio of 5:1 or more, 6:1 or more, 7:1 or more, 8:1 or more, 9:1 or more, 10:1 or more, 11:1 or more, 12:1 more, etc.).

A hardmask layer 115 is shown at 202 deposited on the surface of the substrate 110. The hardmask layer 115 may be a silicon oxide layer. The hardmask layer 115 may be deposited using any of the following deposition techniques: spin coating, chemical vapor deposition, atomic layer deposition, and/or physical vapor deposition.

The hardmask layer, according to one embodiment of the invention, may include silicon oxide. For example, the hardmask deposition chemistry may include tunable SiOC that includes tunable carbon under bake conditions, SiO that includes bake condition and/or precursor chemistry, and/or SiON that with precursor chemistry including $NH_3$ as the source of the nitrogen. Various other deposition techniques may be used to deposit the hardmask layer. Exemplary techniques are described later in this disclosure.

After deposition, the hardmask layer 115 may undergo an optional anneal. The anneal process may be used to strengthen the film, by increasing the E. The anneal may also improve the optical qualities of the hardmask film, for example, by changing the n and k values of the hardmask film. The anneal may include a single step or multistep anneal. The anneal may also be a wet or dry anneal.

According to one embodiment of the invention, a single step anneal may be used. The anneal, according to one embodiment, may occur at temperatures between 30° C. and 750° C. and in an environment comprising $N_2$, Ar, and/or other inert gases. Moreover, the bake environment may include $O_2$, $H_2O$, $NH_3$, and/or $N_2O$. In another embodiment of the invention, the anneal may occur by heating the deposited layer to about 300° C. to about 1000° C. (e.g., about 600° C. to about 900° C.) in a substantially dry atmosphere (e.g., dry nitrogen, helium, argon, etc.). The anneal can remove moisture from the deposited layer and converts Si—OH groups into silicon oxide. The annealed silicon oxide layer may have improved film quality (e.g., a WERR of about 6 to about 3, or less) and improved qualities as a dielectric (e.g., a k-value approaching or equal to pure silicon dioxide). In some embodiments, the anneal step may be carried out at about 900° C. in a nitrogen ambient for about one hour.

In some embodiments, multi-step anneals may include a two-step anneal where the hardmask layer 115 first can undergo a wet anneal stage, such as, for example, heating the layer to, for example, about 650° C. in the presence of steam. This may be followed by a dry anneal stage, where the layer can be heated to a higher temperature (e.g., about 900° C.) in an atmosphere that is substantially free of moisture (e.g., dry $N_2$).

In addition to wet and dry thermal annealing, other annealing techniques (alone or in combination) may be used to anneal the hardmask layer 115. These include a steam anneal, a thermal anneal, an inductively coupled plasma (ICP) anneal, an ultraviolet light anneal, an e-beam anneal, an acid vapor catalysis anneal, a base vapor catalysis anneal and/or a microwave anneal, among others.

The hardmask layer 115 may then be exposed to UV light 130 as shown at 203. The figure shows a pattern of UV light 130 rays incident on the surface of the hardmask layer 115. The UV light 130, for example, may include light with a wavelength of about. The UV light 130 exposure may occur in a Stepper or other photolithography device. The stepper may pass the UV light 130 through a reticle or photomask that produces a UV light 130 pattern on the hardmask layer 115. Various image patterning techniques, devices and/or processes may be used to create a pattern on the hardmask with UV light 130.

After exposure of the hardmask layer 115 to a UV light pattern, a wet etch may occur to remove the portions of the hardmask film that were not exposed to UV light 130, the result of which is shown at 204. The wet etch may include an etchant containing HF. Additional components may also be included in the etchant, such as, for example, HF, $NH_4OH$, SCl, and/or RCA. The wet etch may include components and/or concentrations that improve the etch selectivity between exposed and unexposed portions of the hardmask.

Following the wet etch, plasma treatments and/or anneals may be applied to adjust the properties of the hardmask for future processing. An anneal may be a wet anneal, a dry anneal, a steam anneal, an ultraviolet light anneal, an e-beam anneal, an acid vapor catalysis anneal, a base vapor catalysis anneal and a microwave anneal, a single process anneal and/or a multi-process anneal. The anneal may occur within an inert gas, such as, for example, Ar, Ne, $N_2$, etc., or a reactive environment, such as, for example, $O_2$, $H_2O$, $NH_3$, $N_2/H_2$, and $N_2O$. The plasma treatment may include a capacitively-coupled plasma and/or an inductively-coupled plasma in $O_2$, $N_2$, Ar, $H_2O$, $N_2O$, and/or any inert gas.

Figure 3:
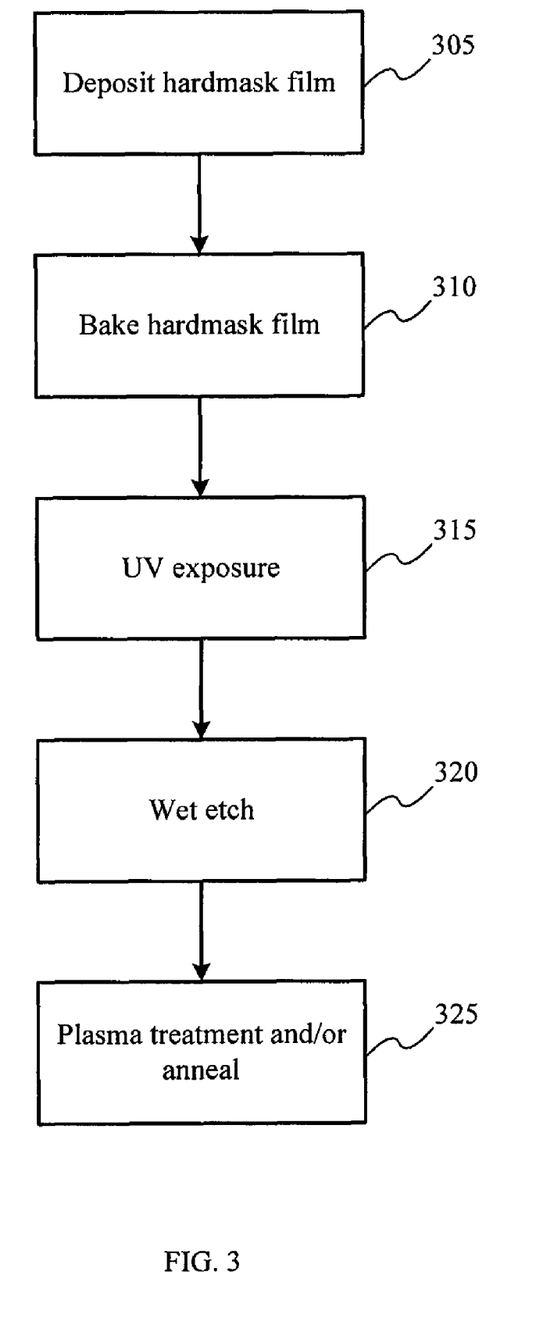
FIG. 3 shows a flowchart depicting a method for patterning a hardmask according to one embodiment of the invention.

FIG. 3 shows a flowchart depicting the various steps of a UV hardmask patterning process according to one embodiment of the invention. A hardmask film is deposited on a substrate at block 305. The hardmask film may comprise, for example, silicon oxide. The deposition may include spin coating, chemical vapor deposition, atomic layer deposition, and physical vapor deposition. Following the deposition, in some cases, the hardmask my be baked or annealed at block 310. Any annealing technique may be employed. The hardmask may then be exposed to a pattern of UV light at block 315. The duration of the exposure may depend on the hardmask chemistry, anneal duration (if any), atmosphere, and/or hardmask requirements. After the UV exposure, the hardmask may be etched, for example, using a wet etch, at block 320. After the etching, an optional plasma treatment and/or anneal may be applied in adjust the hardmask properties at block 325.

Figure 4:
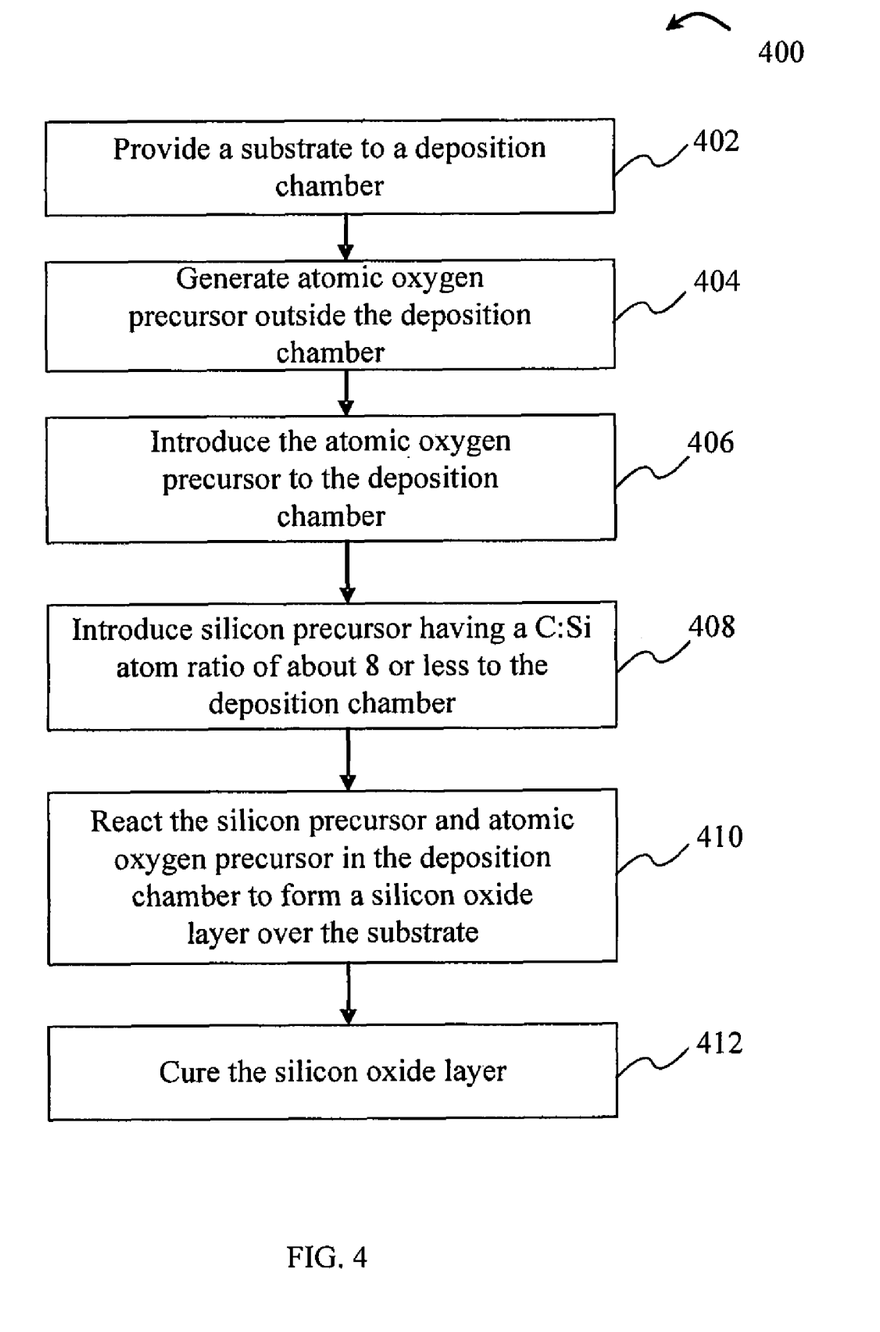
FIG. 4 shows a flowchart of a process including the steps in an exemplary method of forming an oxide layers over a substrate according to one embodiment of the invention.

FIG. 4 shows a flowchart that includes steps in an exemplary method 400 of forming an oxide layers over a substrate. The method 400 can include providing a substrate 110 to a deposition chamber in step 402. The substrate 110 may be a silicon substrate, a III-V compound substrate, a silicon/germanium substrate, an epi-substrate, a silicon-on-insulator substrate, a display substrate such as, for example, a liquid crystal display (LCD), a plasma display, an electro luminescence (EL) lamp display, or a light emitting diode (LED) substrate, for example. In some embodiments, the substrate 110 may include at least one structure, such as, for example, trench structure, well, junction, diode, transistor, metal-oxide-semiconductor field effect transistor (MOSFET), inter-layer dielectric (ILD) structure, inter-metal dielectric (IMD) structure, circuit, other semiconductor structure or various combinations thereof. The substrate 110 may be a semiconductor wafer (e.g., a 200 mm, 300 mm, 400 mm, etc. silicon wafer). In some embodiments, the substrate 110 may have at least one trench such as, for example, trenches formed therein as shown at 200 in FIG. 2. In some embodiments, the substrate 110 may be a semiconductor wafer (e.g., a 200 mm, 300 mm, 400 mm, etc. silicon wafer) and may include structures, device components, etc., formed in earlier processes. For example, the substrate may include the trenches with high height to width aspect ratios (e.g., an aspect ratio of 5:1 or more, 6:1 or more, 7:1 or more, 8:1 or more, 9:1 or more, 10:1 or more, 11:1 or more, 12:1 more, etc.).

In some embodiments, the method 400 may include the remote generation of an atomic oxygen precursor at a location outside the deposition chamber in step 404. The atomic oxygen precursor may be generated by the dissociation of an oxygen containing precursor such as, for example, molecular oxygen ($O_2$), ozone ($O_3$), an nitrogen-oxygen compound (e.g., NO, $NO_2$, $N_2O$, etc.), a hydrogen-oxygen compound (e.g., $H_2O$, $H_2O_2$, etc.), a carbon-oxygen compound (e.g., CO, $CO_2$, etc.), as well as other oxygen containing precursors and combinations of precursors.

In some embodiments, the atomic oxygen precursor may be generated by the dissociation of an ozone-containing precursor. The ozone-containing precursor may be a mixture gas of oxygen and ozone. For example, oxygen can be provided into an ozone generator. Within the ozone generator, at least a portion of oxygen can be ozonized as ozone. In some embodiments, the oxygen may have a flow rate between about 3 standard liters per minute (slm) and about 20 slm. After the ozonization, ozone within oxygen may have a weight percentage between about 6% and about 20%.

In some embodiments, the dissociation of the oxygen containing precursor to generate the atomic oxygen may be done by thermal dissociation, ultraviolet light dissociation, and/or plasma dissociation, among other methods. Plasma dissociation may involve striking a plasma from helium, argon, etc., in a remote plasma generating chamber and introducing the oxygen precursor to the plasma to generate the atomic oxygen precursor.

The atomic oxygen precursor can be introduced to the deposition chamber in step 406 where it may mix for the first time with a silicon precursor, which can be introduced to the chamber in step 408. The atomic oxygen precursor can react with the silicon precursor (and other deposition precursors that may be present in the reaction chamber) at a temperature between about −110° C. and about 200° C. and a pressure between about 10 Torr and about 760 Torr total chamber pressure to form a silicon oxide hardmask layer 115 (shown in FIG. 2) in step 410. The silicon oxide film 110 can reduce the aspect ratio of the trenches to that of trenches.

The silicon precursor may have a C:Si atom ratio of about 8 or less (e.g., a C:Si ratio of 7, 6, 5, 4, 3, 2, 1 or less). This means there can be fewer than 8 carbon atoms in the silicon precursor molecule for every silicon atom present.

In some embodiments, the silicon precursor may be a siloxane compound such as, for example, triethoxysiloxane (TRIES), tetramethoxysiloxane (TMOS), trimethoxysiloxane (TRIMOS), hexamethoxydisiloxane (HMODS), octamethoxytrisiloxane (OMOTS), and/or octamethoxydodecasiloxane (OMODDS), among other siloxane compounds:

In still other embodiments, the silicon precursor may be a halogenated siloxane compound that includes one or more halogen groups (e.g., fluoride, chloride, bromide, or iodide groups). For example, the halogenated siloxane may be a chlorinated siloxane compound such as, for example, tetrachlorosilane (TECS), dichlorodiethoxysiloxane (DCDES), chlorotriethoxysiloxane (CTES), hexachlorodisiloxane (HCDS), and/or octachlorotrisiloxane (OCTS), among other chlorinated siloxane compounds:

The silicon precursor may have an O:Si ratio of about 0, 0.5, 1, 2, 3, 4, 5, 6, etc., or more. For example, TMOS has an O:Si atom ratio of about 4. Other silicon precursors, such as, for example, TRIES, and TRIMOS, have an O:Si ratio of about 3. Still others, such as, for example, HCDS have an O:Si ratio of 0.5, and TECS has an O:Si ratio of 0.

The silicon precursors may include an Si—O—Si linkage, as seen in HMODS, OMOTS, OMODDS, HCDS, and OCTS, among other organo-silicon compounds. This linkage in the silicon precursor may facilitate the formation of $SiO_x$ films with reduced contamination from carbon and hydroxyl groups.

In some embodiments, the silicon precursors may include aminosilanes such as, for example, Trisilylamine (TSA), Hexamethyldisilazane (HMDS), Silatrane, Tetrakis(dimethylamino)silane, Bis(diethylamino)silane, Bis-tert-butylaminosilane; Bis-dimethylaminosilane (BDMAS), Tris(dimethylamino)chlorosilane, and methylsilatrane, among other compounds:

In other embodiments, the silicon precursor may also be a silazoxane compound that includes one or more nitrogen groups. The silazoxane compounds may include hexamethoxydisilazoxane (HMDS-H), methyl hexamethoxydisilazoxane (HMDS-CH$_3$), chlorohexamethoxydisilazoxane (HMDS-Cl), hexaethoxydislazoxane (HEDS-H), nonamethoxytrisilazoxane (NMTS), and octamethoxycyclicsilazoxane (OMCS), among other silazoxane compounds:

-continued

Silatrane

Tetrakis(dimethylamino)silane

Bis(diethylamino)silane

Tris(dimethylamino)chlorosilane

Methylsilatrane

In other embodiments, the silicon precursors may include disilanes including, alkoxy disilanes, alkoxy-alkyl disilanes, and alkoxy-acetoxy disilanes. The alkoxy disilanes may include:

wherein $R_{1-6}$ may be, independently, a $C_{1-3}$ alkyloxy group. For example, the alkoxy disilanes may include hexamethoxydisilane, and hexaethoxydisilane among other alkoxy disilanes.

The alkoxy disilanes may include cyclic disilane compounds with alkoxy groups bonded to the Si moieties. For example, the alkoxycyclosilanes may include octaethoxycyclobutasilane, decabutaoxycyclopentasilane, and dodecamethoxycyclohexasilane, among others. Some examples of alkoxy disilanes are shown below:

Hexamethoxydisilane

Hexaethoxydisilane

Dodecamethoxycyclohexasilane

The alkoxy-alkyl disilanes may include:

wherein $R_{7-12}$ may be, independently, a $C_{1-3}$ alkyl group or a $C_{1-3}$ alkyloxy group, and wherein at least one of $R_{7-12}$ is a alkyl group and at least one of $R_{7-12}$ is an alkyloxy group. Alkoxy-alkyl disilanes may also include cyclic disilanes with alkyl and alkoxy moieties, such as, for example, butasilanes, pentasilanes, hexasilanes, heptasilane, octasilanes, etc., having at least one alkyl and alkoxy group bonded thereto. Examples include octamethyl-1,4-dioxa-2,3,5,6-tetrasilacyclohexane; 1,4-dioxa-2,3,5,6-tetrasilacyclohexane; and 1,2,3,4,5,6-hexamethoxy-1,2,3,4,5,6,-hexamethylcyclohexasilane, among other alkoxy-alkyl cyclosilanes. Some examples of alkoxy-alkyl disilanes are shown below:

octamethyl-1,4-dioxa-2,3,5,6-tetrasilacyclohexane 1,4-dioxa-2,3,5,6-tetrasilacyclohexane 1,1,2,2-tetraethoxy-1,2-dimethyldisilane Alkoxy-acetoxy disilanes may include:

wherein $R_{13-17}$ may be, independently, a $C_{1-3}$ alkyl group, a $C_{1-3}$ alkoxy group, or an acetoxy group, and wherein at least one of $R_{13-17}$ is a alkoxy group and at least one of $R_{13-17}$ is an acetoxy group.

In still other embodiments, the silicon precursors may include organocyclosilanes such as, for example, cyclobutasilane, cyclopentasilane, cyclohexasilane, cycloheptasilane, cyclooctasilane, etc.

In some embodiments, the silicon precursor may be mixed with a carrier gas before or during its introduction to the deposition chamber. A carrier gas may be an inactive gas that does not substantially interfere with the formation of the oxide film 115 over the substrate 110. Examples of carrier gases can include helium, neon, argon, and hydrogen ($H_2$), among other gases.

In embodiments of method 400, the atomic oxygen precursors and silicon precursors may not be mixed before being introduced to the deposition chamber. The precursors may enter the chamber through separate spatially separated precursor inlets distributed around reaction chamber. For example, the atomic oxygen precursor may enter from an inlet (or inlets) at the top of the chamber and positioned directly above the substrate. The inlet may direct the flow of the oxygen precursor in a direction substantially perpendicular to the substrate deposition surface. Meanwhile, the silicon precursor may enter from one or more inlets around the sides of the deposition chamber. The inlets may direct the flow of the silicon precursor in a direction approximately parallel to the deposition surface.

In some embodiments, the atomic oxygen precursors and silicon precursors can be sent through separate ports of a multi-port showerhead. For example, a showerhead positioned above the substrate may include a pattern of openings for the precursors to enter the deposition chamber. One subset of openings may be supplied by the atomic oxygen precursor, while a second subset of openings is supplied by the silicon precursor. Precursors traveling through different sets of opening may be fluidly isolated from each other until exiting into the deposition chamber. Additional details about types and designs of precursor handling equipment is described in a co-assigned U.S. Provisional Patent Application No. 60/803, 499, filed May 30, 2006, entitled "Process Chamber For Dielectric Gapfill," the entire contents of which are hereby incorporated by reference for all purposes.

As the atomic oxygen precursors and silicon precursors may react in the deposition chamber, they can form the silicon oxide layer 115 over the substrate deposition surface in step 410. The initial oxide layer may have desired flowability, and can desirably migrate into gaps, trenches, voids, seams, etc., in the structures present at the deposition surface. This can allow the method 400 to provide oxide fills that can be substantially free of voids and seams in gaps, trenches, and other surface structures that have high height to width aspect ratios (e.g. ARs of about 5:1, 6:1, 6:1, 8:1, 9:1, 10:1, 11:1, and 12:1 or more). The silicon oxide layer may then be cured at block 412.

Figure 5A:
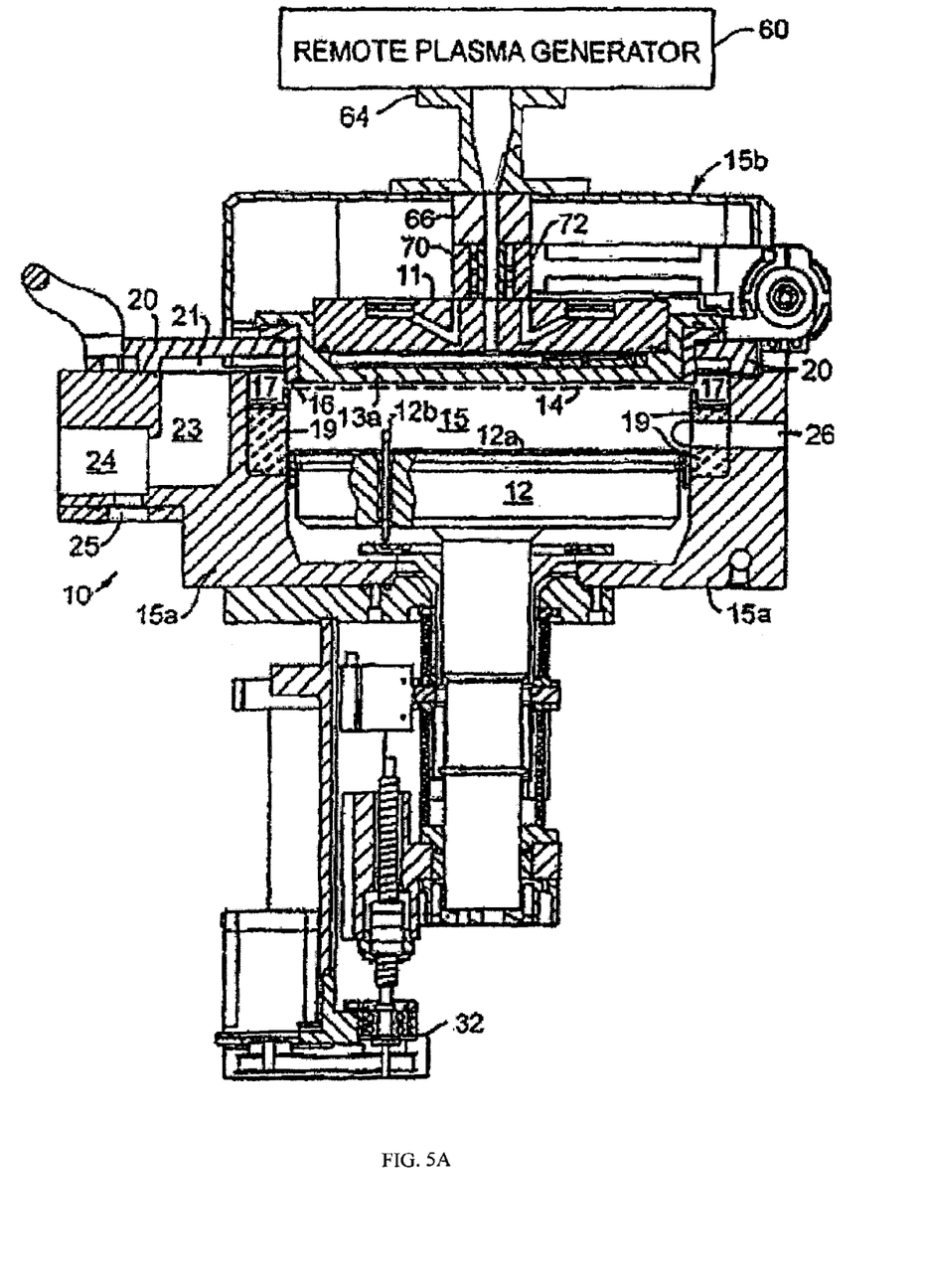
FIG. 5A shows a vertical cross-sectional view of an exemplary thin film deposition system.

Referring now to FIG. 5A, vertical cross-sectional views of a CVD system 10 is shown that has a vacuum or processing chamber 15 that includes a chamber wall 15a and a chamber lid assembly 15b. The CVD system 10 contains a gas distribution manifold 11 for dispersing process gases to a substrate (not shown) that rests on a heated pedestal 12 centered within the process chamber 15. Gas distribution manifold 11 may be formed from an electrically conducting material in order to serve as an electrode for forming a capacitive plasma. During processing, the substrate (e.g. a semiconductor wafer) is positioned on a flat (or slightly convex) surface 12a of the pedestal 12. The pedestal 12 can be moved controllably between a lower loading/off-loading position (depicted in FIG. 5A) and an upper processing position (indicated by dashed line 14 in FIG. 5A), which is closely adjacent to the manifold 11. A centerboard (not shown) includes sensors for providing information on the position of the wafers.

Deposition and carrier gases are introduced into the chamber 15 through perforated holes of a conventional flat, circular gas distribution faceplate 13a. More specifically, deposition process gases flow into the chamber through the inlet manifold 11, through a conventional perforated blocker plate and then through holes in gas distribution faceplate 13a.

Before reaching the manifold 11, deposition and carrier gases are input from gas sources through gas supply lines into a mixing system where they are combined and then sent to manifold 11. Generally, the supply line for each process gas includes (i) several safety shut-off valves (not shown) that can be used to automatically or manually shut-off the flow of process gas into the chamber, and (ii) mass flow controllers (also not shown) that measure the flow of gas through the supply line. When toxic gases are used in the process, the several safety shut-off valves are positioned on each gas supply line in conventional configurations.

The deposition process performed in the CVD system 10 can be either a thermal process or a plasma-enhanced process. In a plasma-enhanced process, an RF power supply applies electrical power between the gas distribution faceplate 13a and the pedestal 12 so as to excite the process gas mixture to form a plasma within the cylindrical region between the faceplate 13a and the pedestal 12. (This region will be referred to herein as the "reaction region"). Constituents of the plasma react to deposit a desired film on the surface of the semiconductor wafer supported on pedestal 12. RF power supply is a mixed frequency RF power supply that typically supplies power at a high RF frequency (RF1) of 13.56 MHz and at a low RF frequency (RF2) of 360 KHz to enhance the decomposition of reactive species introduced into the vacuum chamber 15. In a thermal process, the RF power supply would not be utilized, and the process gas mixture thermally reacts to deposit the desired films on the surface of the semiconductor wafer supported on the pedestal 12, which is resistively heated to provide thermal energy for the reaction.

During a plasma-enhanced deposition process, the plasma heats the entire process chamber 15, including the walls of the chamber body 15a surrounding the exhaust passageway 23 and the shut-off valve 24. When the plasma is not turned on or during a thermal deposition process, a hot liquid is circulated through the walls 15a of the process chamber 15 to maintain the chamber at an elevated temperature. The passages in the remainder of the chamber walls 15a are not shown. Fluids used to heat the chamber walls 15a include the typical fluid types, i.e., water-based ethylene glycol or oil-based thermal transfer fluids. This heating (referred to as heating by the "heat exchanger") beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction byproducts, is evacuated from the chamber 15 by a vacuum pump (not shown). Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side wall 15a (including the upper dielectric lining 19 on the wall) and the bottom of the circular chamber lid 20. The 360° circular symmetry and uniformity of the slot orifice 16 and the plenum 17 are important to achieving a uniform flow of process gases over the wafer so as to deposit a uniform film on the wafer.

From the exhaust plenum 17, the gases flow underneath a lateral extension portion 21 of the exhaust plenum 17, past a viewing port (not shown), through a downward-extending gas passage 23, past a vacuum shut-off valve 24 (whose body is integrated with the lower chamber wall 15a), and into the exhaust outlet 25 that connects to the external vacuum pump (not shown) through a foreline (also not shown).

The wafer support platter of the pedestal 12 (preferably aluminum, ceramic, or a combination thereof) is resistively heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of the pedestal 12.

Typically, any or all of the chamber lining, gas inlet manifold faceplate, and various other reactor hardware are made out of material such as, for example, aluminum, anodized aluminum, or ceramic. An example of such a CVD apparatus is described in co-assigned U.S. Pat. No. 5,558,717 entitled "CVD Processing Chamber," hereby incorporated by reference in its entirety.

A lift mechanism and motor 32 (FIG. 5A) raises and lowers the heater pedestal assembly 12 and its wafer lift pins 12b as wafers are transferred into and out of the body of the chamber 15 by a robot blade (not shown) through an insertion/removal opening 26 in the side of the chamber 10. The motor 32 raises and lowers pedestal 12 between a processing position 14 and a lower, wafer-loading position. The motor, valves or flow controllers connected to the supply lines, gas delivery system, throttle valve, RF power supply, and chamber and substrate heating systems are all controlled by a system controller over control lines, of which only some are shown. Controller relies on feedback from optical sensors to determine the position of movable mechanical assemblies such as, for example, the throttle valve and susceptor which are moved by appropriate motors under the control of controller.

In the exemplary embodiment, the system controller includes a hard disk drive (memory), a floppy disk drive and a processor. The processor contains a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

A system controller controls all of the activities of the CVD machine. The system controller executes system control software, which is a computer program stored in a computer-readable medium such as, for example, a memory. Preferably, the memory is a hard disk drive, but the memory may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to operate controller.

A process for depositing a film on a substrate or a process for cleaning the chamber 15 can be implemented using a computer program product that is executed by the controller. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

Figure 5B:
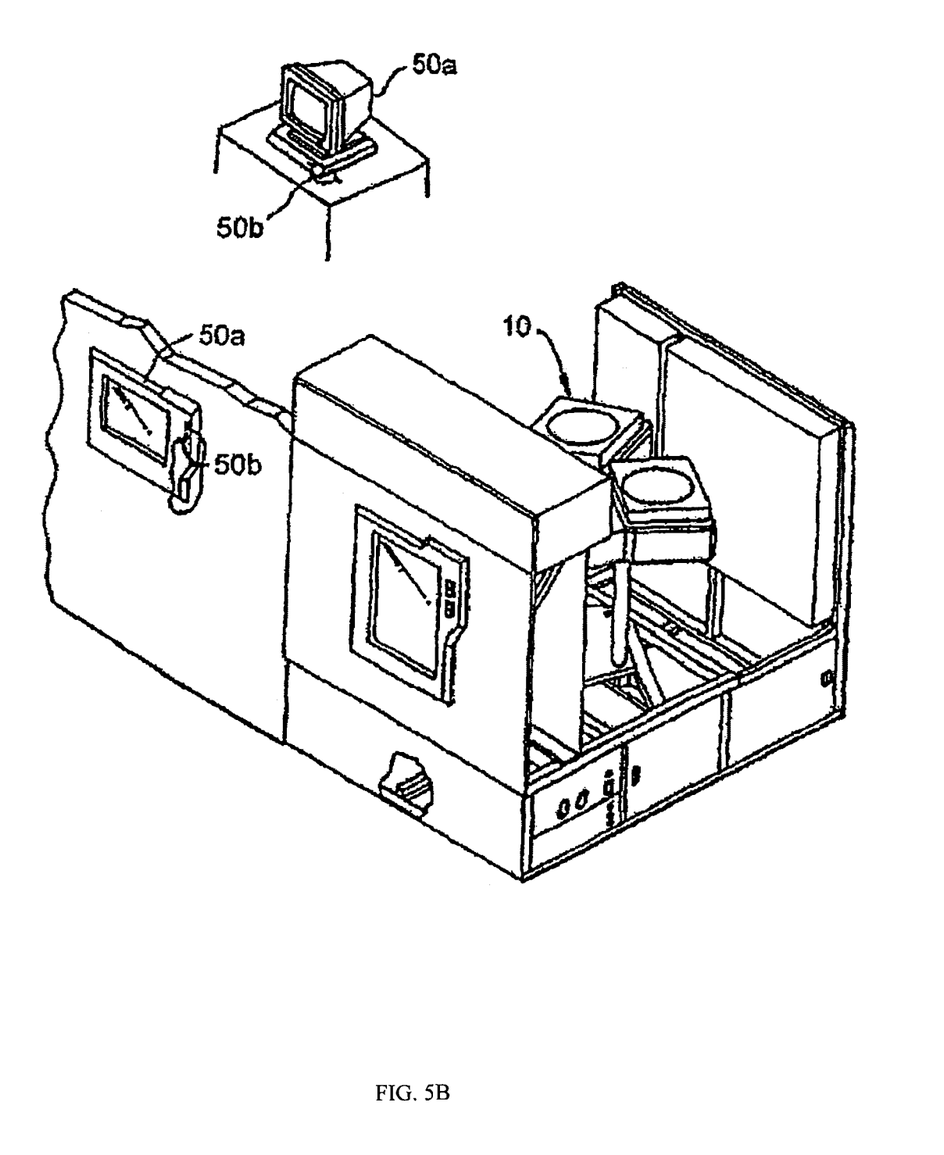
FIG. 5B is a simplified diagram of an exemplary system monitor/controller component of a thin film deposition system.

The interface between a user and the controller is via a CRT monitor 50a and light pen 50b, shown in FIG. 5B, which is a simplified diagram of the system monitor and CVD system 10 in a substrate processing system, which may include one or more chambers. In the preferred embodiment two monitors 50a are used, one mounted in the clean room wall for the operators and the other behind the wall for the service technicians. The monitors 50a simultaneously display the same information, but only one light pen 50b is enabled. A light sensor in the tip of light pen 50b detects light emitted by CRT display. To select a particular screen or function, the operator touches a designated area of the display screen and pushes the button on the pen 50b. The touched area changes its highlighted color, or a new menu or screen is displayed, confirming communication between the light pen and the display screen. Other devices, such as a keyboard, mouse, or other pointing or communication device, may be used instead of or in addition to light pen 50b to allow the user to communicate with controller.

FIG. 5A shows a remote plasma generator 60 mounted on the lid assembly 15b of the process chamber 15 including the gas distribution faceplate 13a and the gas distribution manifold 11. A mounting adaptor 64 mounts the remote plasma generator 60 on the lid assembly 15b, as best seen in FIG. 5A. The adaptor 64 is typically made of metal. A mixing device 70 is coupled to the upstream side of the gas distribution manifold 11 (FIG. 5A). The mixing device 70 includes a mixing insert 72 disposed inside a slot of a mixing block for mixing process gases. A ceramic isolator 66 is placed between the mounting adaptor 64 and the mixing device 70 (FIG. 5A). The ceramic isolator 66 may be made of a ceramic material such as $Al_2O_3$ (99% purity), Teflon®, or the like. When installed, the mixing device 70 and ceramic isolator 66 may form part of the lid assembly 15b. The isolator 66 isolates the metal adaptor 64 from the mixing device 70 and gas distribution manifold 11 to minimize the potential for a secondary plasma to form in the lid assembly 15b as discussed in more detail below. A three-way valve controls the flow of the process gases to the process chamber 15 either directly or through the remote plasma generator 60.

The remote plasma generator 60 is desirably a compact, self-contained unit that can be conveniently mounted on the lid assembly 15b and be easily retrofitted onto existing chambers without costly and time-consuming modifications. One suitable unit is the ASTRON® generator available from Applied Science and Technology, Inc. of Woburn, Mass. The ASTRON® generator utilizes a low-field toroidal plasma to dissociate a process gas. In one example, the plasma dissociates a process gas including a fluorine-containing gas such as $NF_3$ and a carrier gas such as argon to generate free fluorine which is used to clean film deposits in the process chamber 15.

Having described several embodiments, it will be recognized by those of skill in the art that various modifications, alternative constructions, and equivalents may be used without departing from the spirit of the invention. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a method" includes a plurality of such methods and reference to "the precursor" includes reference to one or more precursors and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method for resist free patterning of a hardmask film using ultraviolet light, the method comprising:
   depositing a hardmask layer comprising silicon oxide on a substrate within a deposition chamber;
   annealing the hardmask layer at an elevated temperature for a period of time; thereafter
   exposing portions of the hardmask layer directly to ultraviolet light, wherein the portions of the hardmask layer exposed with ultraviolet light form a pattern of exposed portions of the hardmask layer; and
   patterning the hardmask layer using a wet etch that removes unexposed portions of the hardmask layer while leaving the exposed portions of the hardmask layer on the substrate.

2. The method according to claim 1, wherein the annealing is selected from the group consisting of a steam anneal, a thermal anneal, an inductively coupled plasma anneal, a capacitively-coupled plasma anneal, an ultraviolet light anneal, an e-beam anneal, an acid vapor catalysis anneal, a base vapor catalysis anneal and a microwave anneal.

3. The method according to claim 1, further comprising annealing remaining portions of the hardmask layer after the patterning the hardmask layer.

4. The method according to claim 1, wherein the annealing occurs within an atmosphere comprising an inert gas.

5. The method according to claim 1, wherein the annealing occurs within an atmosphere comprising a gas selected from the group consisting of $N_2$, Ar, $O_2$, $H_2O$, $NH_3$, $N_2/H_2$, and $N_2O$.

6. The method according to claim 1, further comprising providing a plasma treatment to the hardmask film after patterning.

7. The method according to claim 6, wherein the plasma is selected from the group consisting of capacitively-coupled plasma and an inductively-coupled plasma.

8. The method according to claim 6, wherein the plasma treatment occurs with an atmosphere comprising a gas selected from the group consisting of $N_2$, Ar, $O_2$, $H_2O$, $NH_3$, $N_2/H_2$, and $N_2O$.

9. The method according to claim 1, wherein the ultraviolet light comprises light with a wavelength less than or equal to 348 nm.

10. The method according to claim 1, wherein the wet etch includes an etchant selected from the group consisting of HF and $NH_4OH$.

11. The method according to claim 1, wherein the hardmask layer is depositing using a process selected from the group consisting of spin coating, chemical vapor deposition, atomic layer deposition, and physical vapor deposition.

12. The method according to claim 1, wherein the substrate comprises a substrate selected from the group consisting of a silicon substrate, a III-V compound substrate, a silicon/germanium substrate, a silicon-on-insulator substrate, a display substrate, a liquid crystal display substrate, a plasma display substrate, an electro luminescence lamp substrate, and a light emitting diode substrate.

13. The method according to claim 1, wherein the hardmask layer comprises carbon.

14. The method according to claim 1, wherein the hardmask layer comprises nitrogen.

15. A method for resist free patterning of a hardmask film using ultraviolet light, the method comprising:
   depositing a hardmask layer comprising silicon oxide on a substrate within a deposition chamber;
   exposing the hardmask layer to a first anneal process at an elevated temperature for a period of time; thereafter
   exposing portions of the hardmask layer directly to ultraviolet light, wherein the portions of the hardmask layer exposed with ultraviolet light form a pattern of exposed portions of the hardmask layer;
   patterning the hardmask layer using a wet etch that removes unexposed portions of the hardmask layer while leaving the exposed portions of the hardmask layer on the substrate; and thereafter
   exposing the exposed portions of the hardmask layer remaining on the substrate to a second anneal process.

* * * * *